United States Patent
Matsubara et al.

(10) Patent No.: US 11,524,386 B2
(45) Date of Patent: Dec. 13, 2022

(54) GRINDING APPARATUS

(71) Applicant: DISCO CORPORATION, Tokyo (JP)

(72) Inventors: Souichi Matsubara, Tokyo (JP); Tetsuo Kubo, Tokyo (JP); Shinji Yamashita, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 164 days.

(21) Appl. No.: 16/829,282

(22) Filed: Mar. 25, 2020

(65) Prior Publication Data

US 2020/0316750 A1    Oct. 8, 2020

(30) Foreign Application Priority Data

Apr. 5, 2019   (JP) .............................. JP2019-072603

(51) Int. Cl.
| | |
|---|---|
| *B24B 49/04* | (2006.01) |
| *B24B 41/00* | (2006.01) |
| *B24B 5/50* | (2006.01) |
| *B24B 7/22* | (2006.01) |
| *H01L 21/304* | (2006.01) |
| *B24B 49/02* | (2006.01) |

(52) U.S. Cl.
CPC ............... *B24B 49/04* (2013.01); *B24B 5/50* (2013.01); *B24B 7/228* (2013.01); *B24B 41/005* (2013.01); *B24B 49/02* (2013.01); *H01L 21/304* (2013.01)

(58) Field of Classification Search
None
See application file for complete search history.

(56) References Cited

U.S. PATENT DOCUMENTS

| | | | | |
|---|---|---|---|---|
| 8,822,241 | B2* | 9/2014 | Nakata | H01L 22/20 438/16 |
| 2008/0076334 | A1* | 3/2008 | Yoshida | B24B 1/00 451/177 |
| 2010/0258539 | A1* | 10/2010 | Sakamoto | B23K 26/38 219/121.62 |
| 2013/0130593 | A1* | 5/2013 | Kalenian | B24B 49/04 451/5 |
| 2015/0239093 | A1* | 8/2015 | Fukui | H01L 23/49524 451/5 |
| 2018/0099375 | A1* | 4/2018 | Ando | B24B 7/228 |
| 2019/0291240 | A1* | 9/2019 | Shibata | B24B 7/16 |
| 2020/0139503 | A1* | 5/2020 | Kodama | B24B 49/12 |

FOREIGN PATENT DOCUMENTS

| | | |
|---|---|---|
| JP | 2013004726 A | 1/2013 |
| JP | 2015009295 A | 1/2015 |

* cited by examiner

*Primary Examiner* — Joel D Crandall
*Assistant Examiner* — Makena S Markman
(74) *Attorney, Agent, or Firm* — Greer Burns & Crain, Ltd.

(57) ABSTRACT

A grinding apparatus including a chuck table for holding a wafer, a grinding unit having a spindle for rotating a grinding wheel, an inclination adjusting unit for adjusting the inclination of the rotation axis of the chuck table with respect to the rotation axis of the spindle, a touch panel, and a control portion. The control portion is adapted to compare the information regarding the target sectional shape input into a target shape input field with the information regarding the present sectional shape input into a present shape input field and then control the inclination adjusting unit to change the inclination of the rotation axis of the chuck table so that the wafer is ground to obtain the target sectional shape of the wafer.

8 Claims, 9 Drawing Sheets

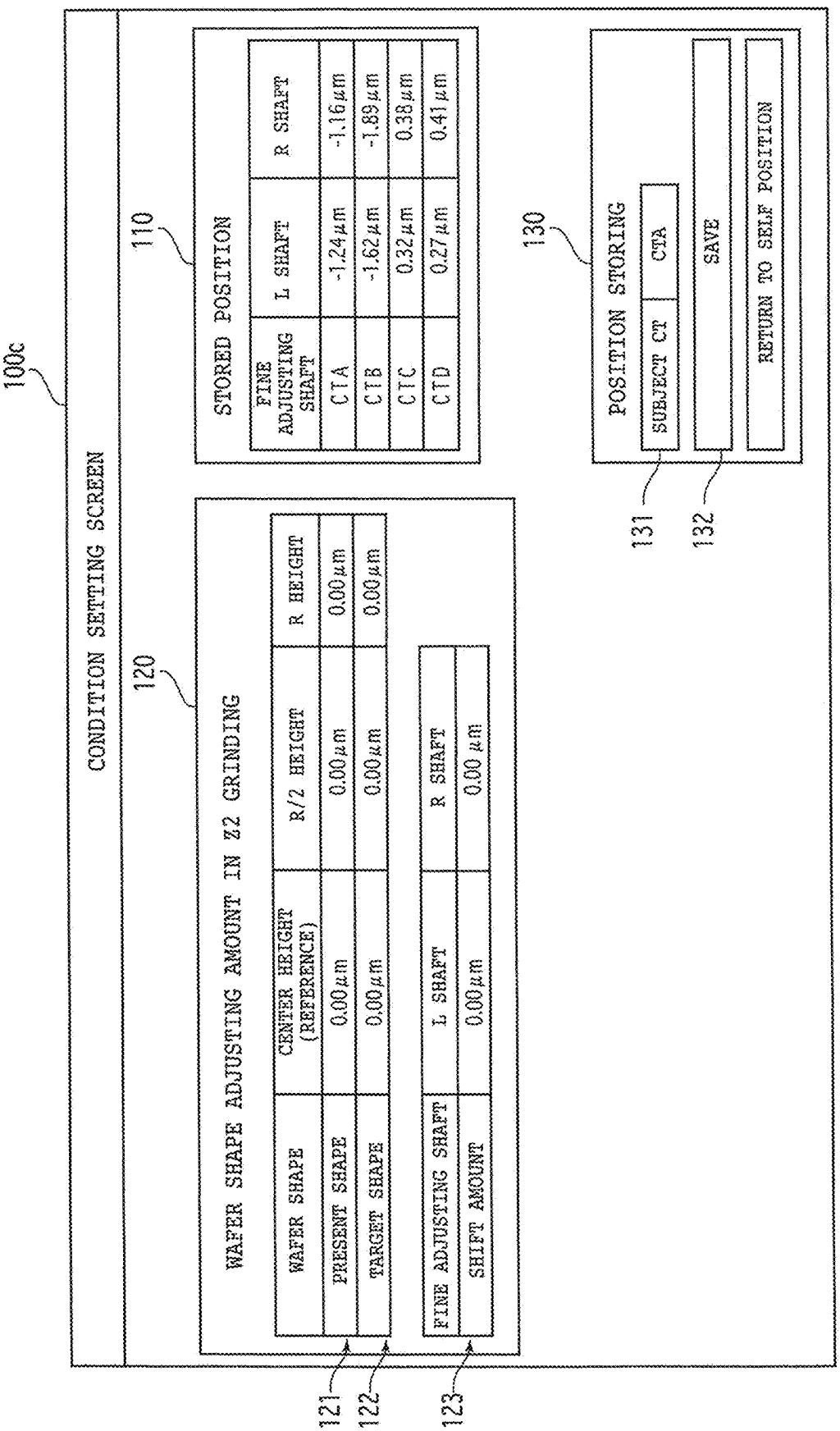

GRINDING APPARATUS

BACKGROUND OF THE INVENTION

Field of the Invention

The present invention relates to a grinding apparatus for grinding a wafer by using abrasive members.

Description of the Related Art

In a grinding apparatus for grinding a wafer by using abrasive members, a grinding wheel having the abrasive members arranged annularly is rotated and a chuck table having a holding surface is rotated in the condition where the wafer is held on the holding surface. In grinding the wafer, the grinding wheel is positioned above the wafer held on the holding surface of the chuck table in such a manner that the abrasive members pass through the center of the wafer as viewed in plan during the rotation of the grinding wheel. Accordingly, the abrasive members are adapted to come into contact with a radial area of the wafer to thereby grind the wafer. To make the radial area of the wafer on the holding surface parallel to the grinding surface of each abrasive member, the relation between the inclination of a rotation axis of the chuck table and the inclination of a rotation axis of the grinding wheel is adjusted (see JP 2015-009295A, for example).

Further, after performing the grinding, the wafer is polished to increase a die strength. That is, grinding mark formed in grinding the wafer is removed by the polishing. In polishing the wafer, a polishing pad is pressed on the wafer so as to cover the wafer, so that a central portion of the wafer tends to be polished more. Accordingly, if the wafer is ground to obtain a uniform thickness and this wafer is next polished, the sectional shape of the wafer polished becomes a center thin type sectional shape such that the central portion of the wafer is thinner than the peripheral portion of the wafer. To make the thickness of the wafer uniform in the condition after performing the polishing, there has been proposed a technique of grinding the wafer to obtain a center thick type sectional shape such that the central portion of the wafer is thicker than the peripheral portion of the wafer (see JP 2013-004726A, for example).

SUMMARY OF THE INVENTION

However, the polishing amount at the central portion of the wafer and at the peripheral portion of the wafer varies according to polishing conditions including the materials of the polishing pad, abrasive grains, and the wafer as a workpiece, the time of pressing of the polishing pad to the wafer, and the load of pressing of the polishing pad to the wafer. That is, the center thin shape of the wafer polished varies according to the polishing conditions. To cope with this problem, it is necessary to change the difference in thickness between the central portion and the peripheral portion of the center thick type wafer ground, according to the polishing conditions, thereby adjusting the center thick shape of the wafer.

The adjustment of the center thick shape of the wafer is performed by changing the inclination of the rotation axis of the chuck table with respect to the rotation axis of the grinding wheel. However, this adjustment of the inclination requires the repetition of the grinding, the polishing, and the measurement of the wafer thickness, causing an increase in time required.

It is therefore an object of the present invention to provide a grinding apparatus which can facilitate the adjustment of the inclination of the rotation axis of the chuck table with respect to the rotation axis of the grinding wheel.

In accordance with an aspect of the present invention, there is provided a grinding apparatus including a holding unit including a chuck table having a holding surface for holding a wafer, the chuck table being rotatable about a rotation axis passing through the center of the holding surface; a grinding unit including a spindle having a rotation axis and a grinding wheel mounted at the lower end of the spindle, the grinding wheel having a plurality of abrasive members arranged annularly, whereby when the spindle is rotated to thereby rotate the grinding wheel, the wafer held on the chuck table is ground by the abrasive members of the grinding wheel being rotated; an inclination adjusting unit for adjusting the inclination of the rotation axis of the chuck table with respect to the rotation axis of the spindle; and a touch panel. The abrasive members are adapted to grind the wafer held on the chuck table in a grinding area as a radial area ranging from the center of the holding surface to the outer circumference thereof. The touch panel is adapted to display a target shape input field for inputting information regarding a target sectional shape of the wafer and a present shape input field for inputting information regarding a present sectional shape of the wafer ground in the condition where the inclination of the rotation axis of the chuck table has not yet been changed. The grinding apparatus further includes a control portion for comparing the information regarding the target sectional shape of the wafer as input into the target shape input field with the information regarding the present sectional shape of the wafer as input into the present shape input field and then controlling the inclination adjusting unit to change the inclination of the rotation axis of the chuck table so that the wafer is ground to obtain the target sectional shape of the wafer.

Preferably, the holding unit includes a plurality of holding units each having the chuck table. The grinding apparatus further includes a positioning unit for moving one of the plurality of holding units to a grinding position where the wafer is ground by the grinding unit. The touch panel is adapted to further display a selecting portion for use in selecting one of the plurality of holding units. The control portion is adapted to change the inclination of the rotation axis of the chuck table in the holding unit selected by using the selecting portion.

Preferably, information regarding the sectional shape of the wafer is input into the target shape input field and the present shape input field every time processing conditions are set in processing the wafer.

According to the present invention, a target sectional shape of the wafer can be set on the touch panel. Further, a present sectional shape of the wafer can be input into the touch panel. According to the result of comparison between the target sectional shape and the present sectional shape, the control portion can control the inclination adjusting unit to change the inclination of the rotation axis of the chuck table so that the wafer is ground to obtain the target sectional shape.

In the case that the grinding apparatus includes a plurality of holding units and that the touch panel includes a selecting portion for use in selecting one of the plural holding units, the holding unit as a subject to the adjustment of the inclination of the rotation axis can be selected on the touch panel.

In the case that information regarding the sectional shape of the wafer is input into the target shape input field and the present shape input field every time processing conditions are set in processing the wafer, a plurality of wafers having different sectional shapes can be obtained in one grinding apparatus.

The above and other objects, features, and advantages of the present invention and the manner of realizing them will become more apparent, and the invention itself will best be understood from a study of the following description and appended claims with reference to the attached drawings showing a preferred embodiment of the invention.

BRIEF DESCRIPTION OF DRAWINGS

FIG. 10 is an illustration similar to FIG. 6, depicting a condition that each fine adjusting shaft has been moved and the present position of each fine adjusting shaft has been updated to be displayed.

DETAILED DESCRIPTION OF THE PREFERRED EMBODIMENT

Figure 1:
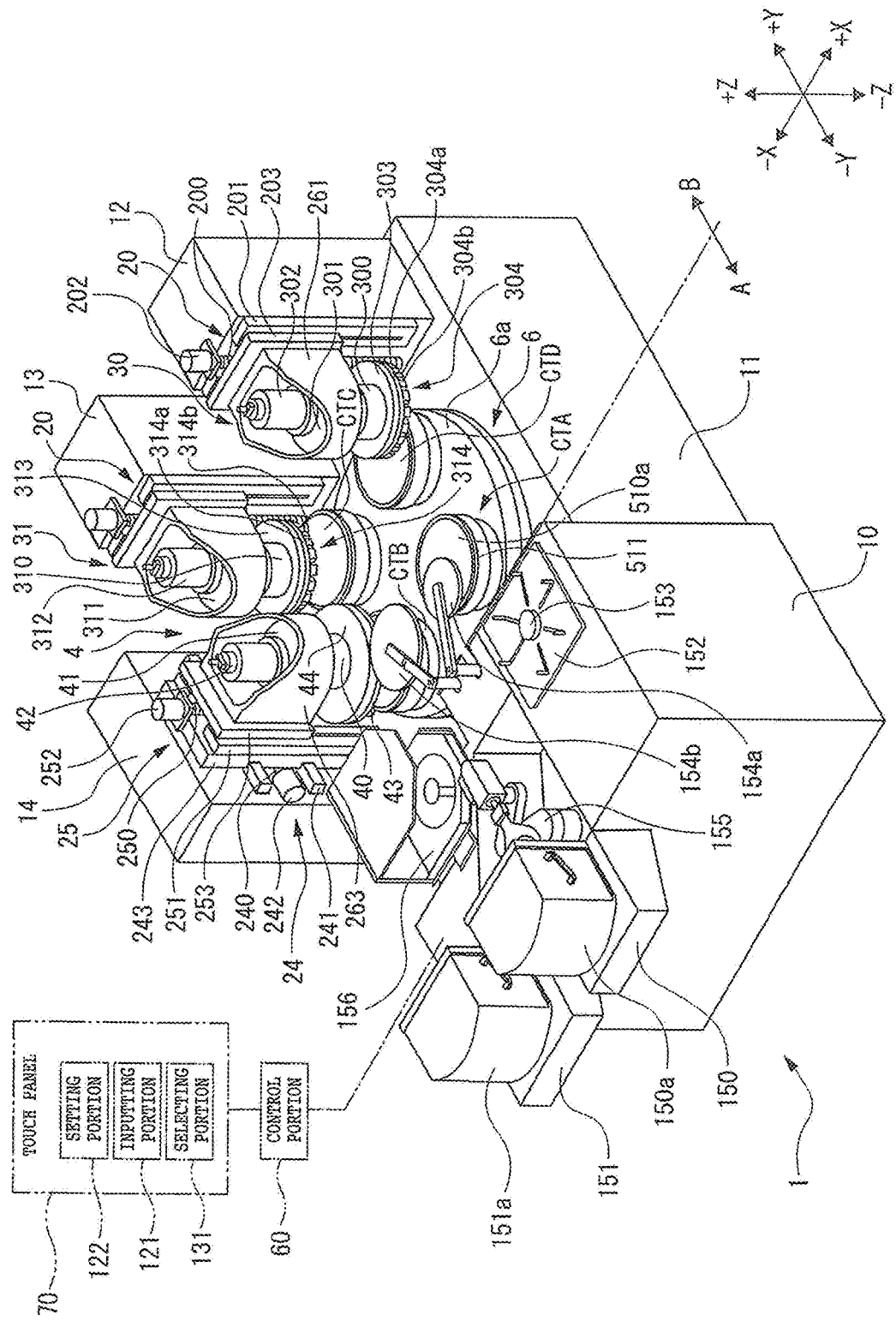
FIG. 1 is a perspective view depicting a grinding apparatus according to a preferred embodiment of the present invention.

Referring to FIG. 1, there is depicted a grinding apparatus 1 according to a preferred embodiment of the present invention. The grinding apparatus 1 includes a first grinding unit 30, a second grinding unit 31, and a polishing unit 4. The first grinding unit 30 and the second grinding unit 31 function to grind a wafer (not depicted in FIG. 1) held on a chuck table to be hereinafter described. The polishing unit 4 functions to polish the wafer ground by the first grinding unit 30 and the second grinding unit 31. The grinding apparatus 1 includes a first base housing 10 and a second base housing 11 connected to the first base housing 10 on the rear side thereof in the +Y direction depicted by an arrow +Y in FIG. 1. A standby area A is defined on the upper surface of the first base housing 10. The standby area A is an area where a wafer to be ground is loaded to the chuck table or the wafer polished is unloaded from the chuck table. On the other hand, a processing area B is defined on the upper surface of the second base housing 11. The processing area B is an area where the wafer loaded to the chuck table is processed by the first grinding unit 30, the second grinding unit 31, and the polishing unit 4.

A first cassette mounting portion 150 and a second cassette mounting portion 151 are provided on the front surface of the first base housing 10 in the −Y direction depicted by an arrow −Y in FIG. 1. A first cassette 150a storing a plurality of wafers to be processed is mounted on the first cassette mounting portion 150. A second cassette 151a for storing the wafers processed is mounted on the second cassette mounting portion 151.

A robot 155 is provided on the rear side of the first cassette 150a in the +Y direction. The robot 155 functions to take one of the wafers out of the first cassette 150a before processing and take the wafer into the second cassette 151a after processing. A temporary setting area 152 is formed adjacent to the robot 155. The wafer taken out of the first cassette 150a is transferred to the temporary setting area 152 by the robot 155. A positioning unit 153 is provided in the temporary setting area 152, so as to position the wafer in the temporary setting area 152.

A first transfer unit 154a is provided adjacent to the positioning unit 153, so as to transfer the wafer from the temporary setting area 152 to the chuck table. The first transfer unit 154a is so configured as to hold the wafer and rotate about a vertical axis. That is, the first transfer unit 154a functions to hold the wafer positioned by the positioning unit 153 in the temporary setting area 152 and then transfer the wafer to the chuck table provided in the processing area B. A second transfer unit 154b is provided adjacent to the first transfer unit 154a, so as to unload the wafer from the chuck table after processing. The second transfer unit 154b is also configured so as to hold the wafer and rotate about a vertical axis. A cleaning unit 156 is provided adjacent to the second transfer unit 154b, so as to clean the wafer transferred by the second transfer unit 154b after processing. That is, the wafer processed is transferred from the chuck table to the cleaning unit 156 by the second transfer unit 154b. The wafer cleaned by the cleaning unit 156 is transferred from the cleaning unit 156 to the second cassette 151a by the robot 155 and then stored into the second cassette 151a by the robot 155.

A first column 12 is provided on the second base housing 11 at the rear end thereof in the +Y direction so as to stand upright therefrom. A grinder feeding unit 20 for feeding the first grinding unit 30 is provided on the front surface of the first column 12 in the −Y direction. The grinder feeding unit 20 includes a ball screw 200 having a vertical axis extending in the Z direction (i.e., both in the +Z direction depicted by an arrow +Z and in the −Z direction depicted by an arrow −Z), a pair of guide rails 201 extending parallel to the ball screw 200, a motor 202 connected to the upper end of the ball screw 200 for rotating the ball screw 200, and a vertically movable plate 203 having an internal nut threadedly engaged with the ball screw 200 and having a pair of sliding portions respectively slidably mounted on the pair of guide rails 201. Accordingly, when the ball screw 200 is rotated by the motor 202, the vertically movable plate 203 is moved in the Z direction (i.e., both in the +Z direction and in the −Z direction) as being guided by the guide rails 201, so that the first grinding unit 30 provided on the vertically movable plate 203 is moved (fed) in the Z direction.

The first grinding unit 30 includes a spindle 300 having a vertical axis extending in the Z direction, a housing 301 for rotatably supporting the spindle 300, a motor 302 for rotating the spindle 300, a circular mount 303 fixed to the lower end of the spindle 300, and a grinding wheel 304 detachably mounted on the lower surface of the mount 303. The grinding wheel 304 includes a wheel base 304a and a plurality of abrasive members 304b provided on the lower surface of the wheel base 304a so as to be arranged annularly along the outer circumference of the wheel base 304a. Each abrasive member 304b has a shape like a rectangular prism. Accordingly, the plural abrasive members 304b are arranged to form an annular ring. Each abrasive member 304b is an abrasive member for use in coarse grinding and contains abrasive grains having a relatively large size. That is, the first grinding unit 30 functions as a coarse grinding unit for performing coarse grinding to the wafer. The first grinding unit 30 is held by a holder 261 mounted on the front surface of the vertically movable plate 203 in the −Y direction.

Further, a second column 13 is provided on the second base housing 11 at the rear end thereof in the +Y direction so as to stand upright therefrom. The second column 13 is juxtaposed to the first column 12 in the X direction, more specifically, in the −X direction depicted by an arrow −X. That is, the first column 12 is juxtaposed to the second column 13 in the +X direction depicted by an arrow +X. Another grinder feeding unit 20 for feeding the second grinding unit 31 is provided on the front surface of the second column 13 in the −Y direction. This grinder feeding unit 20 for feeding the second grinding unit 31 has the same configuration as that of the grinder feeding unit 20 for feeding the first grinding unit 30. Accordingly, the second grinding unit 31 is moved (fed) in the Z direction by the grinder feeding unit 20 provided on the second column 13. The second grinding unit 31 includes a spindle 310 having a vertical axis extending in the Z direction, a housing 311 for rotatably supporting the spindle 310, a motor 312 for rotating the spindle 310, a circular mount 313 fixed to the lower end of the spindle 310, and a grinding wheel 314 detachably mounted on the lower surface of the mount 313. The grinding wheel 314 includes a wheel base 314a and a plurality of abrasive members 314b provided on the lower surface of the wheel base 314a so as to be arranged annularly along the outer circumference of the wheel base 314a. Each abrasive member 314b has a shape like a rectangular prism. Accordingly, the plural abrasive members 314b are arranged to form an annular ring. Each abrasive member 314b is an abrasive member for use in fine grinding and contains abrasive grains having a relatively small size. That is, the second grinding unit 31 functions as a fine grinding unit for performing fine grinding to the wafer.

Further, a third column 14 is provided on the second base housing 11 at the left end thereof in the −X direction so as to stand upright therefrom. A Y moving unit 24 for moving the polishing unit 4 in the Y direction is provided on the front surface of the third column 14 in the +X direction. The Y moving unit 24 includes a ball screw 240 having a horizontal axis extending in the Y direction, a pair of guide rails 241 extending parallel to the ball screw 240, a motor 242 for rotating the ball screw 240, and a horizontally movable plate 243 having an internal nut threadedly engaged with the ball screw 240 and having a pair of sliding portions respectively slidably mounted on the pair of guide rails 241. Accordingly, when the ball screw 240 is rotated by the motor 242, the horizontally movable plate 243 is moved in the Y direction (i.e., both in the +Y direction and in the −Y direction) as being guided by the guide rails 241, so that the polishing unit 4 provided on the horizontally movable plate 243 is moved in the Y direction.

Further, a polisher feeding unit 25 for feeding the polishing unit 4 is provided on the front surface of the horizontally movable plate 243 in the +X direction. That is, the polisher feeding unit 25 functions to vertically move the polishing unit 4 toward and away from the chuck table. The polisher feeding unit 25 includes a ball screw 250 having a vertical axis extending in the Z direction, a pair of guide rails 251 extending parallel to the ball screw 250, a motor 252 connected to the upper end of the ball screw 250 for rotating the ball screw 250, and a vertically movable plate 253 having an internal nut threadedly engaged with the ball screw 250 and having a pair of sliding portions respectively slidably mounted on the pair of guide rails 251. Accordingly, when the ball screw 250 is rotated by the motor 252, the vertically movable plate 253 is moved in the Z direction (i.e., both in the +Z direction and in the −Z direction) as being guided by the guide rails 251, so that the polishing unit 4 provided on the vertically movable plate 253 is moved (fed) in the Z direction so as to come toward and away from the chuck table.

The polishing unit 4 includes a spindle 40 having a vertical axis extending in the Z direction, a housing 41 for rotatably supporting the spindle 40, a motor 42 for rotating the spindle 40, a circular mount 44 connected to the lower end of the spindle 40, and a polishing pad 43 fixed to the lower surface of the mount 44 for polishing the wafer held on the chuck table. The polishing unit 4 is held by a holder 263 mounted on the front surface of the vertically movable plate 253 in the +X direction.

As depicted in FIG. 1, a turn table 6 having an upper surface 6a is rotatably provided on the second base housing 11, and four chuck tables CTA, CTB, CTC, and CTD are rotatably provided on the upper surface 6a of the turn table 6 so as to be arranged at equal intervals in the circumferential direction of the turn table 6. A rotating shaft (not depicted) for rotating the turn table 6 is provided at the center of the turn table 6, so that the turn table 6 is rotatable about the vertical axis of this rotating shaft. Accordingly, when the turn table 6 is rotated about its axis, the four chuck tables CTA, CTB, CTC, and CTD are also rotated about the center of the turn table 6, so that each of these chuck tables CTA to CTD can be sequentially moved from a loading position near the temporary setting area 152 through a first grinding position below the first grinding unit 30 and a second grinding position below the second grinding unit 31 to a polishing position below the polishing unit 4. That is, the turn table 6 functions as a positioning unit for moving each of the chuck tables CTA to CTD to the first grinding position, the second grinding position, and the polishing position.

Figure 2:
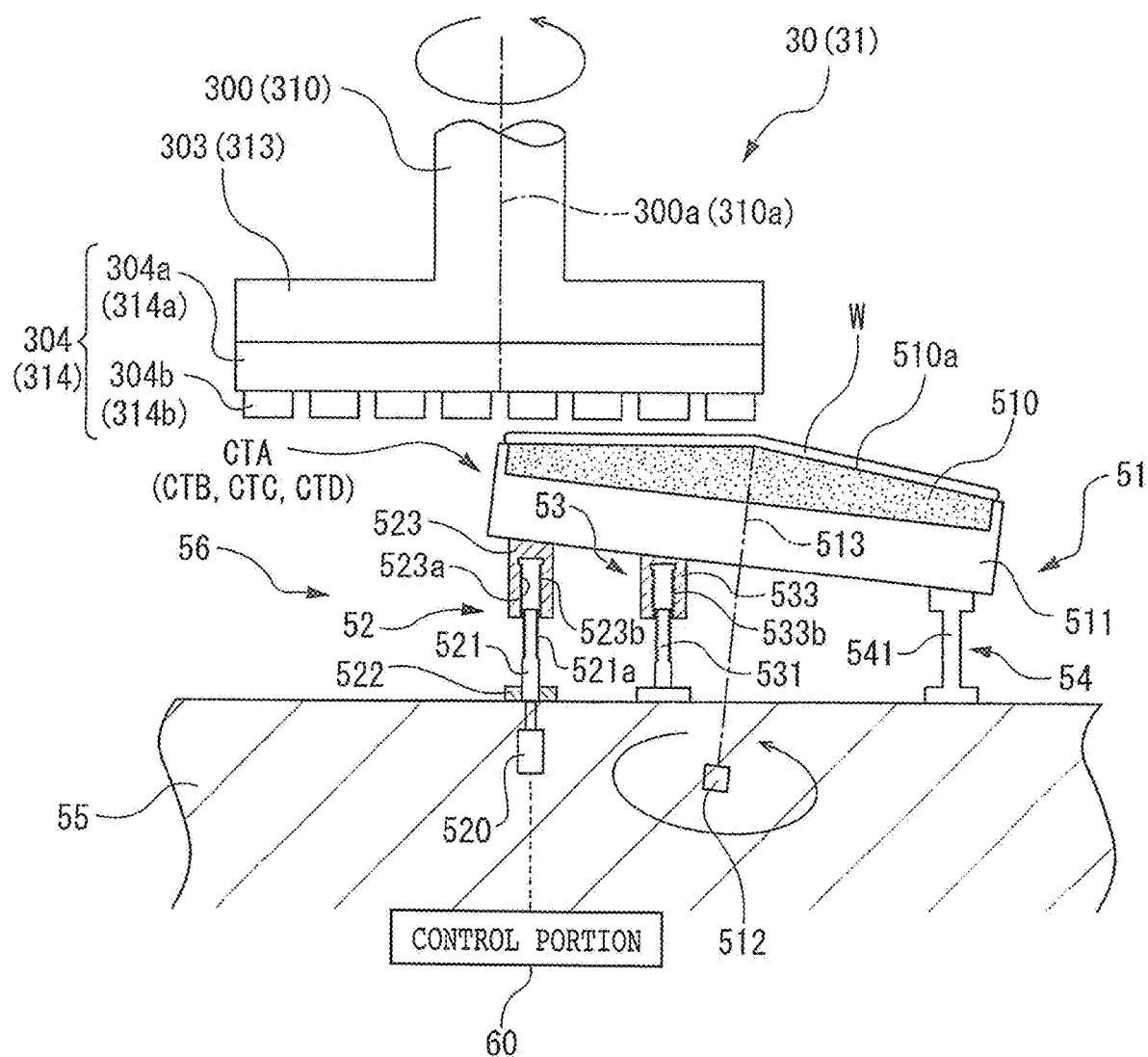
FIG. 2 is a sectional side view of a holding unit and a grinding unit included in the grinding apparatus depicted in FIG. 1.

As depicted in FIG. 2, the spindle 300 of the first grinding unit 30 has a rotation axis 300a vertically extending in the Z direction, and the grinding wheel 304 is rotated about the rotation axis 300a of the spindle 300. Similarly, the spindle 310 of the second grinding unit 31 has a rotation axis 310a vertically extending in the Z direction, and the grinding wheel 314 is rotated about the rotation axis 310a of the spindle 310.

Each of the four chuck tables CTA to CTD includes a suction holding portion 510 formed from a porous member for holding the wafer under suction and a circular cylindrical frame 511 for supporting the suction holding portion 510. A motor 512 is provided below each of the four chuck tables CTA to CTD. The motor 512 functions to rotate each of the four chuck tables CTA to CTD about a rotation axis 513. Each of the four chuck tables CTA to CTD, the motor 512, and the rotation axis 513 constitute a holding unit 51. The suction holding portion 510 is connected to a vacuum source (not depicted) for producing a suction force. The suction holding portion 510 has an upper exposed surface as a holding surface 510a for holding the wafer under suction. That is, the suction force produced from the vacuum source is transmitted to the holding surface 510a of the suction holding portion 510, thereby holding the wafer on the holding surface 510a under suction.

Each of the four chuck tables CTA to CTD is supported by an inclination adjusting unit 56 for adjusting the inclination of the rotation axis 513 passing through the center of the holding surface 510a. The inclination adjusting unit 56 includes at least three supporting portions. At least two of these supporting portions are movable supporting portions 52 and 53, and the remaining one is a fixed supporting portion 54. The movable supporting portions 52 and 53 and the fixed supporting portion 54 are provided on the lower surface of the frame 511 so as to be arranged at equal intervals in the circumferential direction of the frame 511. As a modification, the inclination adjusting unit 56 may include three movable supporting portions and no fixed supporting portion. That is, the inclination adjusting unit 56 may include three movable supporting portions only. As another modification, the inclination adjusting unit 56 may include four or more supporting portions including at least three movable supporting portions and at least one fixed supporting portion.

The movable supporting portion 52 includes a motor 520 provided in an internal base 55 of the grinding apparatus 1, a fine adjusting shaft 521 connected to the motor 520 and adapted to be rotated by the motor 520, a supporting portion 522 for rotatably supporting the fine adjusting shaft 521, and a receiving portion 523 projecting downward from the lower surface of the frame 511 and having a hole for receiving an upper portion of the fine adjusting shaft 521. The motor 520 is connected to a control portion 60 and adapted to be operated under the control by the control portion 60. The control portion 60 also functions to control the operation of each component of the grinding apparatus 1.

An external thread 521a is formed at the upper portion of the fine adjusting shaft 521, and an internal thread 523a is formed on the inner side surface of the receiving portion 523, in which the external thread 521a of the fine adjusting shaft 521 is engaged with the internal thread 523a of the receiving portion 523. Further, an origin sensor 523b for detecting the position of the upper end of the fine adjusting shaft 521 is provided on the inner side surface of the receiving portion 523. The control portion 60 functions to recognize the relative position of the upper end of the fine adjusting shaft 521 with respect to the origin sensor 523b. Further, the supporting portion 522 is fixed to the upper surface of the internal base 55.

The other movable supporting portion 53 has the same configuration as that of the movable supporting portion 52. That is, the movable supporting portion 53 includes a motor (not depicted) provided in the internal base 55, a fine adjusting shaft 531 connected to this motor and adapted to be rotated by this motor, a supporting portion 532 for rotatably supporting the fine adjusting shaft 531, and a receiving portion 533 projecting downward from the lower surface of the frame 511 and having a hole for receiving an upper portion of the fine adjusting shaft 531. This motor is also connected to the control portion 60 and adapted to be operated under the control by the control portion 60. An external thread 531a is formed at the upper portion of the fine adjusting shaft 531, and an internal thread 533a is formed on the inner side surface of the receiving portion 533, in which the external thread 531a of the fine adjusting shaft 531 is engaged with the internal thread 533a of the receiving portion 533. Further, an origin sensor 533b for detecting the position of the upper end of the fine adjusting shaft 531 is provided on the inner side surface of the receiving portion 533. The control portion 60 functions to recognize the relative position of the upper end of the fine adjusting shaft 531 with respect to the origin sensor 533b. Further, the supporting portion 532 is fixed to the upper surface of the internal base 55.

On the other hand, the fixed supporting portion 54 includes a fixed shaft 541 having a lower end fixed to the upper surface of the internal base 55 and an upper end fixed to the lower surface of the frame 511.

In the movable supporting portion 52, the motor 520 is controlled by the control portion 60 to rotate the fine adjusting shaft 521, so that the external thread 521a of the fine adjusting shaft 521 is relatively moved with respect to the internal thread 523a of the receiving portion 523. As a result, the receiving portion 523 is vertically moved, and the height of the frame 511 with respect to the internal base 55 is accordingly changed at the position where the receiving portion 523 is provided. The operation of the other movable supporting portion 53 is similar to that of the movable supporting portion 52. On the other hand, in the fixed supporting portion 54, the height of the frame 511 with respect to the internal base 55 is not changed at the position where the fixed shaft 541 is provided. Thus, the receiving portion 523 is vertically moved with respect to the fine adjusting shaft 521 or the receiving portion 533 is vertically moved with respect to the fine adjusting shaft 531, thereby changing the inclination of the rotation axis 513 of the chuck table CTA (CTB, CTC, or CTD) with respect to the rotation axis 300a of the spindle 300.

The holding surface 510a is a conical surface, and a part (radial area) of this conical surface is made parallel to the lower surface (grinding surface) of each abrasive member 304b or 314b by the operation of the inclination adjusting unit 56.

As depicted in FIG. 1, the grinding apparatus 1 includes a touch panel 70 for use in inputting processing conditions or in displaying the condition of the wafer being processed. The touch panel 70 includes a setting portion 122 for use in setting a target sectional shape of the wafer and storing this target sectional shape, an inputting portion 121 for use in inputting a present sectional shape of the wafer in the case of grinding the wafer in relation to the present inclination of the rotation axis 513, and a selecting portion 131 for use in selecting any one of the four chuck tables CTA to CTD constituting the four holding units 51. The target sectional shape of the wafer to be set by the setting portion 122 and the present sectional shape of the wafer to be input by the inputting portion 121 are vertical sectional shapes as obtained by cutting the wafer along the diameter thereof.

The operation of the grinding apparatus 1 will now be described in the sequence of steps.

1. Preparing Step

In a preparing step, processing conditions for coarse grinding, fine grinding, and polishing are input from the touch panel 70. In actually performing the processing, the control portion 60 reads the processing conditions input and the controls the operation of the grinding apparatus 1 under the processing conditions read. Typically, the control portion 60 includes a computing unit (processor) and a storing unit (memory). For example, the computing unit operates according to a program stored in the storing unit, thereby performing various kinds of control necessary for the processing under the processing conditions input. Further, the control portion 60 controls the inclination adjusting unit 56 depicted in FIG. 2 according to the content input from the touch panel 70 and the target sectional shape of the wafer. That is, under the control by the control portion 60, the inclination of the rotation axis 513 of each chuck table with respect to the rotation axis 300a or 310a of each grinding unit is adjusted by operating the inclination adjusting unit 56. This adjustment will be hereinafter described in more detail.

2. Grinding Step

After inputting the processing conditions from the touch panel 70, the robot 155 is operated to take one of the wafers to be processed out of the first cassette 150a and next transfer the wafer to the positioning unit 153. After positioning the wafer in the temporary setting area 152 by operating the positioning unit 153, the first transfer unit 154a is operated to transfer the wafer from the positioning unit 153 to one of the four chuck tables CTA to CTD at the loading position near the first transfer unit 154a. It is now assumed that the wafer is transferred to the chuck table CTA and then held thereon.

Figure 3:
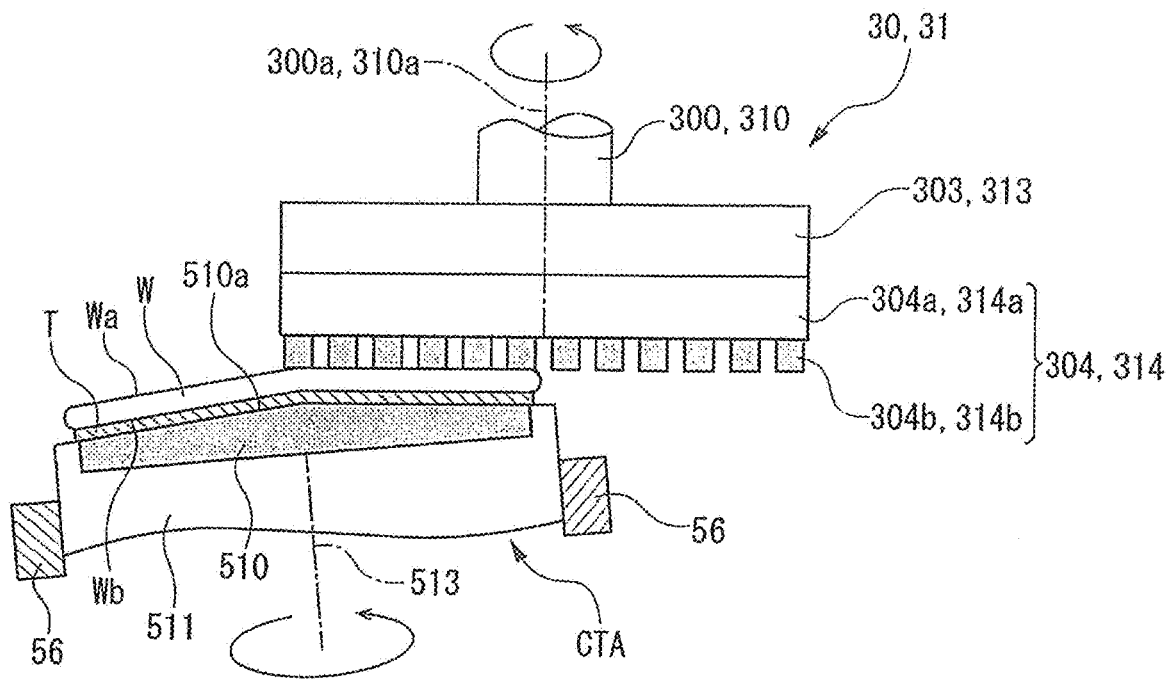
FIG. 3 is a sectional side view depicting a grinding operation of grinding a wafer by using the grinding unit.

As depicted in FIG. 3, the wafer W has an upper surface Wa and a lower surface Wb, and a protective tape T is previously attached to the lower surface Wb of the wafer W. The wafer W is held through the protective tape T on the holding surface 510a of the chuck table CTA. Thereafter, the turn table 6 is rotated a predetermined angle (e.g., 90 degrees) to move the wafer W to the first grinding position below the first grinding unit 30. Thereafter, the chuck table CTA is rotated about the rotation axis 513, and the spindle 300 is rotated about the rotation axis 300a to thereby rotate the grinding wheel 304. Further, the grinder feeding unit 20 for feeding the first grinding unit 30 is operated to feed (lower) the first grinding unit 30 in the −Z direction until the abrasive members 304b of the grinding wheel 304 being rotated come into contact with the upper surface Wa of the wafer W. Thus, the upper surface Wa of the wafer W is coarsely ground by the abrasive members 304b. At this time, the abrasive members 304b come into the radial area of the upper surface Wa of the wafer W.

Although not depicted, the grinding apparatus 1 includes a thickness measuring unit for measuring the thickness of the wafer W. This thickness measuring unit includes a holding surface gauge for measuring the height of the holding surface 510a and a wafer gauge for measuring the height of the upper surface Wa of the wafer W, in which the thickness of the wafer W is measured from the difference between the height measured by the holding surface gauge and the height measured by the wafer gauge. Accordingly, when the thickness of the wafer W as measured above becomes a predetermined thickness, the first grinding unit 30 is raised in the +Z direction by the grinder feeding unit 20 to finish the coarse grinding.

Thereafter, the turn table 6 depicted in FIG. 1 is further rotated a predetermined angle (e.g., 90 degrees) to thereby move the wafer W to the second grinding position below the second grinding unit 31. Thereafter, as depicted in FIG. 3, the chuck table CTA is rotated about the rotation axis 513, and the spindle 310 is rotated about the rotation axis 310a to thereby rotate the grinding wheel 314. Further, the grinder feeding unit 20 for feeding the second grinding unit 31 is operated to feed (lower) the second grinding unit 31 in the −Z direction until the abrasive members 314b of the grinding wheel 314 being rotated come into contact with the upper surface Wa of the wafer W as coarsely ground. Thus, the upper surface Wa of the wafer W coarsely ground is further finely ground by the abrasive members 314b. When the thickness of the wafer W becomes a predetermined thickness, the second grinding unit 31 is raised in the +Z direction by the grinder feeding unit 20 to finish the fine grinding.

Figure 4:
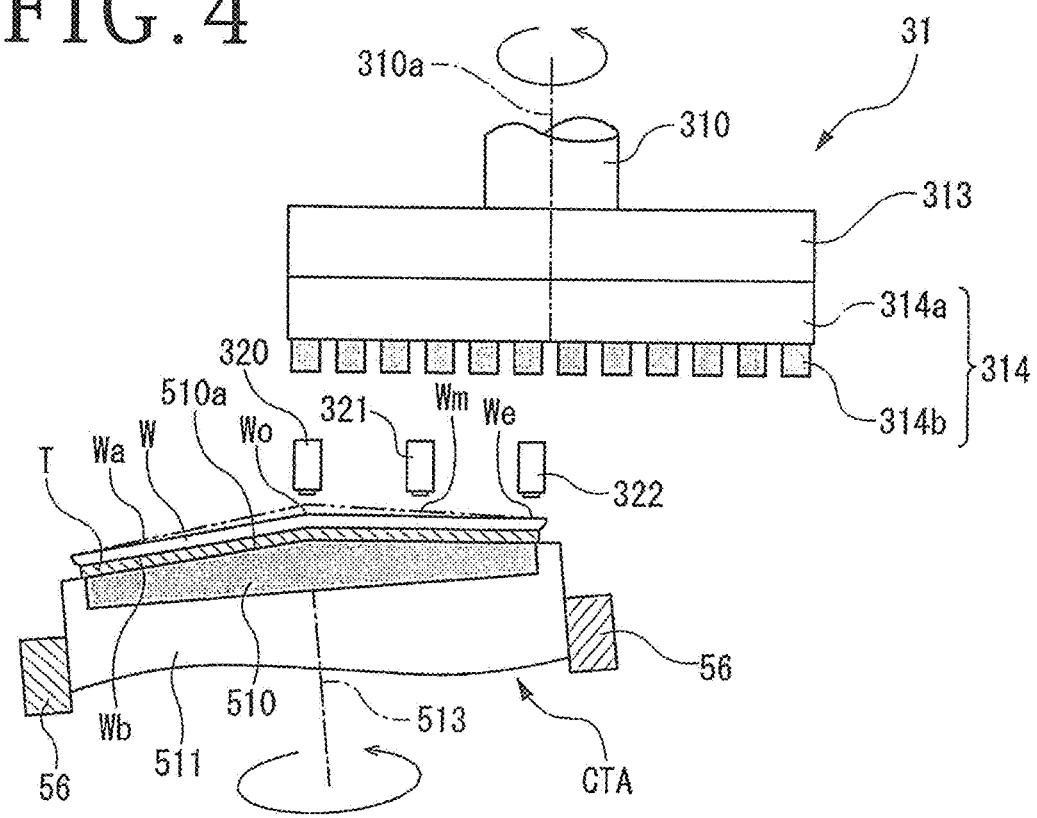
FIG. 4 is a sectional side view depicting a manner of measuring the thickness of the wafer ground by the grinding unit.

As depicted in FIG. 4, three thickness measuring units 320, 321, and 322 are provided in the vicinity of the second grinding unit 31. The thickness measuring unit 320 functions to measure the thickness of a central portion Wo of the wafer W finely ground. The thickness measuring unit 322 functions to measure the thickness of a peripheral portion We of the wafer W finely ground. The thickness measuring unit 321 functions to measure the thickness of an intermediate portion Wm between the central portion Wo and the peripheral portion We of the wafer W finely ground. The control portion 60 can read the thicknesses measured by the three thickness measuring units 320, 321, and 322. As a modification, a single thickness measuring unit may be provided so as to be movable in the radial direction of the wafer W, so that the thicknesses of the central portion Wo, the intermediate portion Wm, and the peripheral portion We of the wafer W can be measured by radially moving the single thickness measuring unit.

Figure 5A:
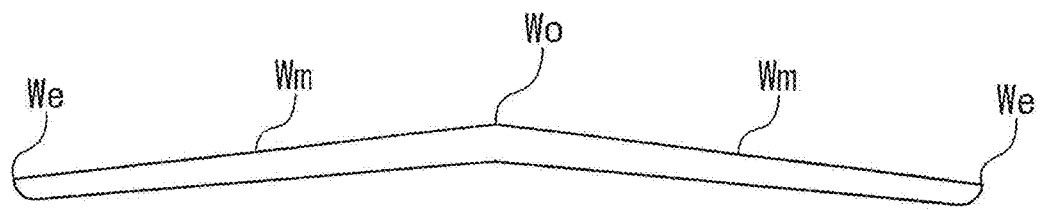
FIG. 5A is a sectional view depicting a center thick type wafer.
Figure 5B:
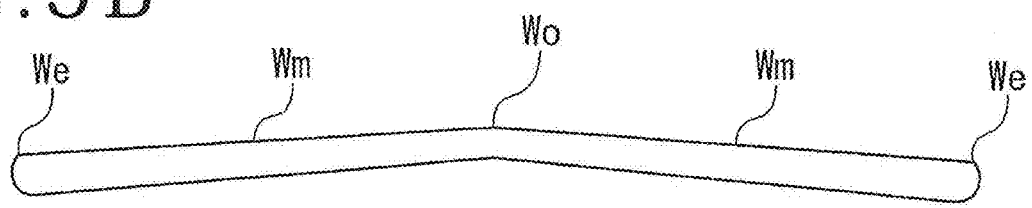
FIG. 5B is a sectional view depicting a center thin type wafer.
Figure 5C:
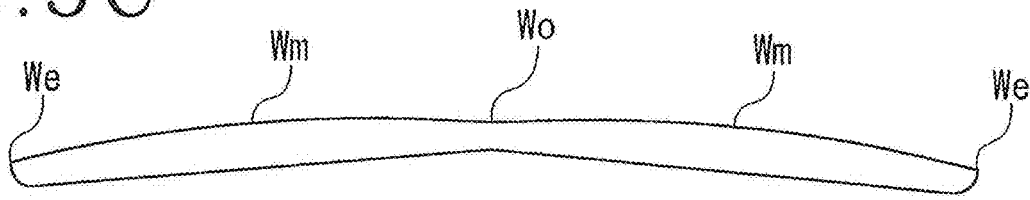
FIG. 5C is a sectional view depicting a gull wing type wafer.
Figure 5D:
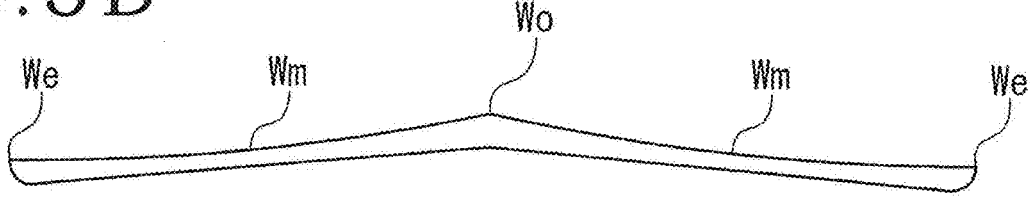
FIG. 5D is a sectional view depicting an inverted gull wing type wafer.
Figure 5E:
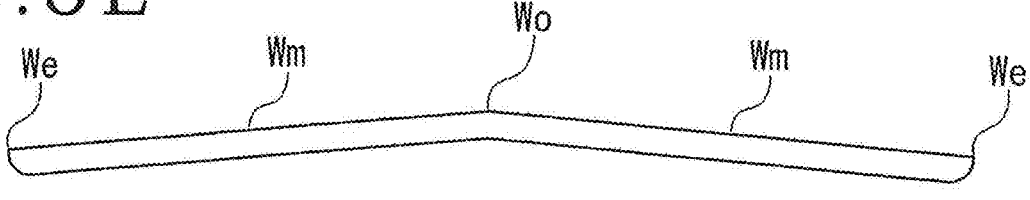
FIG. 5E is a sectional view depicting a uniform type wafer.

FIGS. 5A to 5E depict various sectional shapes of the wafer W in the condition after performing the fine grinding. That is, FIG. 5A depicts a center thick type such that the thickness of the central portion Wo is larger than that of the peripheral portion We. FIG. 5B depicts a center thin type such that the thickness of the central portion Wo is smaller than that of the peripheral portion We. FIG. 5C depicts a gull wing type such that the thickness of the intermediate portion Wm is larger than that of the central portion Wo and that of the peripheral portion We. FIG. 5D depicts an inverted gull wing type such that the thickness of the intermediate portion Wm is smaller than that of the central portion Wo and that of the peripheral portion We. FIG. 5E depicts a uniform type such that the thickness of the central portion Wo is equal to that of the intermediate portion Wm and that of the peripheral portion We. By operating the thickness measuring units 320, 321, and 322 depicted in FIG. 4 to measure the thicknesses of the central portion Wo, the intermediate portion Wm, and the peripheral portion We, it is possible to determine which of the types depicted in FIGS. 5A to 5E the sectional shape of the wafer W belongs to.

In FIG. 4, the sectional shape of the wafer W is of a uniform type as depicted by a solid line. However, the central portion of the wafer W is polished more by the polishing unit 4. Accordingly, to make the sectional shape of the wafer W into a uniform type in the condition after polishing, an ideal sectional shape of the wafer W in the condition after finishing the fine grinding is of a center thick type as depicted by a phantom line in FIG. 4.

3. Polishing Step

After finishing the fine grinding, the turn table 6 is further rotated a predetermined angle (e.g., 90 degrees) to thereby move the wafer W to the polishing position below the polishing unit 4. Thereafter, the chuck table CTA is rotated and the spindle 40 is rotated to thereby rotate the polishing pad 43. Further, the polisher feeding unit 25 is operated to feed (lower) the polishing unit 4 in the −Z direction until the polishing pad 43 being rotated come into contact with the upper surface Wa of the wafer W finely ground. Accordingly, the upper surface Wa of the wafer W is polished by the polishing pad 43. When the thickness of the wafer W polished above becomes a predetermined thickness, the polishing unit 4 is raised in the +Z direction by the polisher feeding unit 25 to finish the polishing.

After finishing the polishing, the wafer W thus polished is held and unloaded from the chuck table CTA by the second transfer unit 154*b* and then transferred to the cleaning unit 156 by the second transfer unit 154*b*. Thereafter, the wafer W is cleaned by the cleaning unit 156, and next transferred from the cleaning unit 156 to the second cassette 151*a* by the robot 155. Finally, the wafer W is stored into the second cassette 151*a* by the robot 155.

4. Setting of Processing Conditions in the Preparing Step

Figure 6:
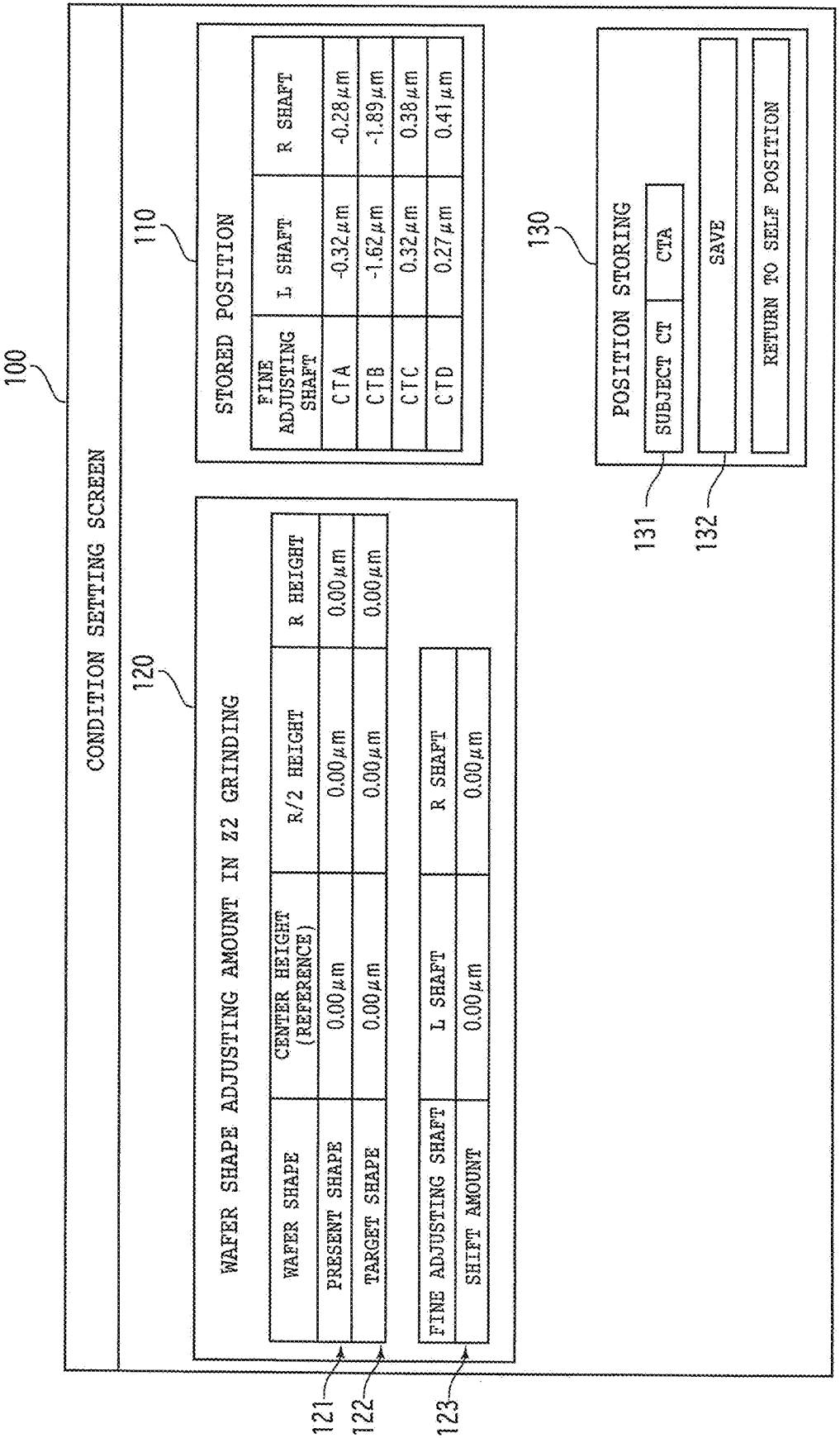
FIG. 6 is an illustration depicting a condition setting screen displayed on a touch panel.

In setting the processing conditions for the fine grinding in the preparing step, a condition setting screen 100 depicted in FIG. 6 is displayed on the touch panel 70. The condition setting screen 100 has a fine adjusting shaft stored position display field 110, a wafer shape adjusting amount in Z2 grinding input field 120, and a position storing field 130. In the condition setting screen 100, the symbol Z2 means the second grinding unit 31 depicted in FIG. 1.

Figure 7:
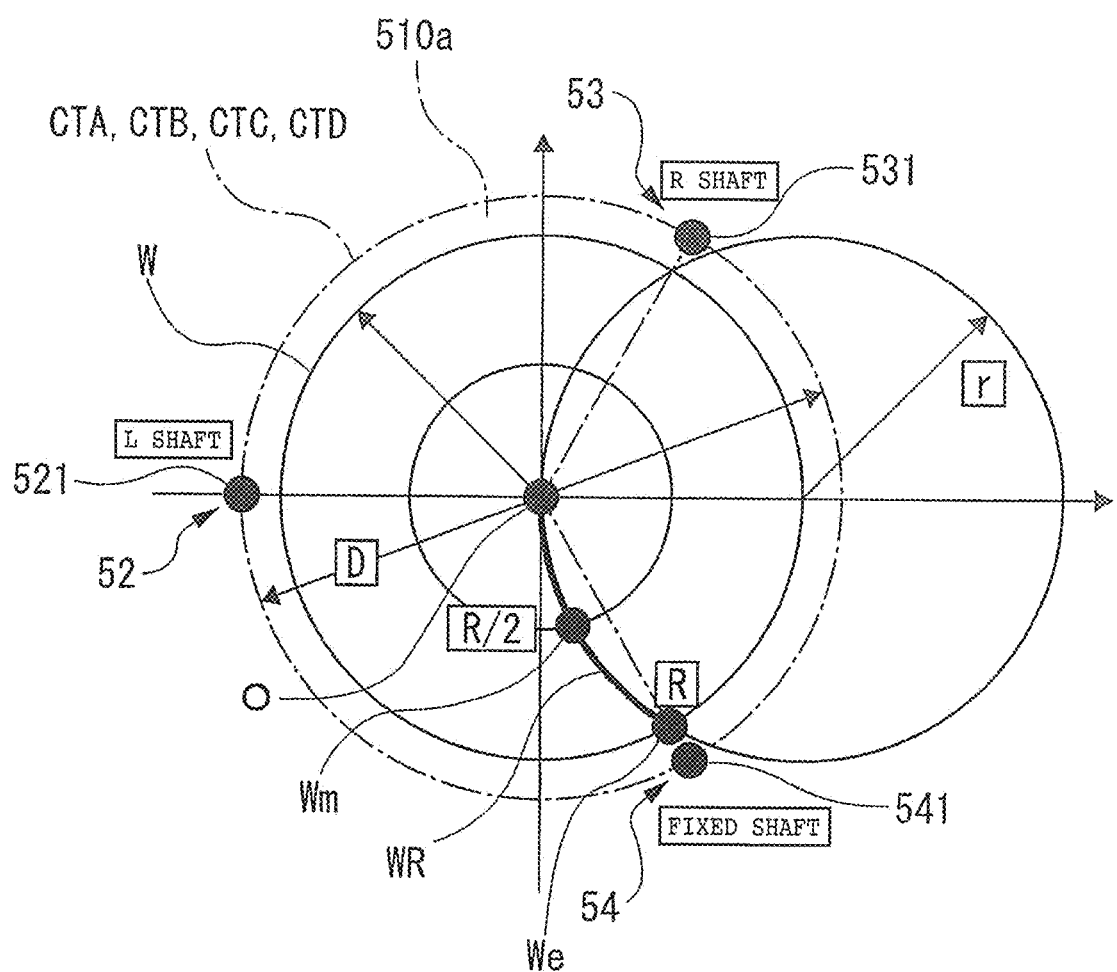
FIG. 7 is a schematic plan view depicting the relation among a chuck table, a wafer, and an annular ring formed by plural abrasive members and also depicting the positions of two fine adjusting shafts and a fixed shaft.

As depicted in FIG. 7, the two movable supporting portions 52 and 53 and the fixed supporting portion 54 are located at three points lying on a circle corresponding to the outer circumference of each of the four chuck tables CTA to CTD in such a manner that these three points form a regular triangle having a center of gravity coinciding with the center of the holding surface 510*a* as viewed in plan. That is, the two movable supporting portions 52 and 53 and the fixed supporting portion 54 are provided between each chuck table and the internal base 55 depicted in FIG. 2 at the three positions directly below the vertices of the above regular triangle. In the condition setting screen 100 depicted in FIG. 6, "L shaft" means the fine adjusting shaft 521 of the movable supporting portion 52, and "R shaft" means the fine adjusting shaft 531 of the movable supporting portion 53. As depicted in FIG. 7, the center of the circle passing through the L shaft, the R shaft, and the fixed shaft 541 of the fixed supporting portion 54 coincides with the center O of the holding surface 510*a* of each of the chuck tables CTA to CTD. Reference symbol D in FIG. 7 denotes the diameter of the holding surface 510*a*. The fixed shaft 541, the fine adjusting shaft 521, and the fine adjusting shaft 531 are arranged at equal intervals at the three positions directly below the outer circumference of the holding surface 510*a*.

The wafer W is smaller in diameter than the holding surface 510*a*. In FIG. 7, reference symbol R denotes the radius of the wafer W. Further, reference symbol r denotes the radius of the annular ring formed by the plural abrasive members 314*b* to be used in performing the fine grinding in the grinding step. Since each abrasive member 314*b* has a width, the radius r of the annular ring means the radius of a circle passing through the center of the width of each abrasive member 314*b*.

As depicted in FIG. 2, the holding surface 510*a* is a conical surface, and the abrasive members 314*b* come into contact with the upper surface Wa of the wafer W in a grinding area WR as the radial area of the wafer W depicted in FIG. 7. This grinding area WR extends from the center O of the holding surface 510*a* toward the fixed shaft 541. Further, the distance from the center O to the intermediate portion Wm of the grinding area WR is equal to the half (R/2) of the radius R of the wafer W.

In the condition setting screen 100 depicted in FIG. 6, the fine adjusting shaft stored position display field 110 depicts the present Z positions of the fine adjusting shaft 521 and 531 of the two movable supporting portions 52 and 53 of the inclination adjusting unit 56 depicted in FIG. 2, that is, the present Z positions of the L shaft and the R shaft depicted in FIG. 7. In the fine adjusting shaft stored position display field 110, "CTA" means the chuck table CTA, "CTB" means the chuck table CTB, "CTC" means the chuck table CTC, and "CTD" means the chuck table CTD. Further, in the display field 110, the value for the L shaft in each of the chuck tables CTA to CTD depicts the distance between the origin sensor 523*b* and the upper end of the fine adjusting shaft 521 of the movable supporting portion 52 depicted in FIG. 2. Similarly, the value for the R shaft in each of the chuck tables CTA to CTD depicts the distance between the origin sensor 533*b* and the upper end of the fine adjusting shaft 531 of the movable supporting portion 53 depicted in FIG. 2. In the display field 110, the minus sign for each value means that the upper end of the fine adjusting shaft 521 or 531 is lower in level than the origin sensor 523*b* or 533*b*.

In the condition setting screen 100 depicted in FIG. 6, the wafer shape adjusting amount in Z2 grinding input field 120 includes a present shape input field 121, a target shape input field 122, and a fine adjusting shaft shift amount display field 123.

The present shape input field 121 is a field for inputting information (data) regarding the actual sectional shape of the wafer W as measured after performing test fine grinding using the second grinding unit 31. In the present shape input field 121, the thicknesses measured by the three thickness measuring units 320, 321, and 322 depicted in FIG. 4 are input. The value for "center height (reference)" is a measured value by the thickness measuring unit 320, the value for "R/2 height" is a measured value by the thickness measuring unit 321, and the value for "R height" is a measured value by the thickness measuring unit 322. The present shape input field 121 functions as the inputting portion 121 for inputting the present sectional shape of the wafer as depicted in FIG. 1.

The target shape input field 122 is a field for inputting information (data) regarding the target sectional shape of the wafer W in the condition after performing the polishing by the polishing unit 4. In the target shape input field 122, the value for "center height (reference)" is a target value for the height of the central portion Wo of the wafer W, the value for "R/2 height" is a target value for the height of the intermediate portion Wm of the wafer W, and the value for "R height" is a target value for the height of the peripheral portion We of the wafer W. The target shape input field 122 functions as the setting portion 122 for inputting the target sectional shape of the wafer W and setting the same as depicted in FIG. 1.

The inputting portion 121 and the setting portion 122 are used to input and set the values every time the processing conditions are set in processing the wafer W. In other words, information (data) regarding the sectional shape of the wafer W is input into the present shape input field 121 and the target shape input field 122 every time the processing conditions are set in processing the wafer W.

The fine adjusting shaft shift amount display field 123 depicted at a lower position in the wafer shape adjusting amount in Z2 grinding input field 120 is a field for displaying the adjustment amount for the height of each of the L shaft as the fine adjusting shaft 521 and the R shaft as the fine adjusting shaft 531, so as to obtain the target sectional shape of the wafer W. The values in the display field 123 are calculated by the control portion 60 according to the values in the present shape input field 121 and the target shape input field 122. In the case of upward shifting the L shaft and the R shaft, a plus sign is attached to the values, whereas in the case of downward shifting the L shaft and the R shaft, a minus sign is attached to the values.

The position storing field 130 includes a selecting portion 131 for use in selecting one of the four chuck tables CTA to CTD and applying the adjustment amounts for the L shaft and the R shaft displayed in the display field 123 to this selected chuck table. The position storing field 130 further includes a save button 132 adapted to be touched by the operator in saving the adjustment amounts. In the selecting portion 131, a field of "subject CT" is adapted to be touched by the operator, thereby displaying a pull-down menu. Accordingly, the operator can select any one of the chuck tables CTA to CTD from this pull-down menu. In FIG. 6, "CTA" is selected in the selecting portion 131 as an example.

The control portion 60 depicted in FIG. 1 reads out the information (data) regarding the target sectional shape of the wafer W as set in the setting portion 122 and the information (data) regarding the present sectional shape of the wafer W as input into the inputting portion 121. Thereafter, the control portion 60 controls the movable supporting portions 52 and 53 so as to obtain the target sectional shape of the wafer W as set in the setting portion 122 in the condition after performing the polishing, according to the values for the center height (reference) at the central portion Wo, the R/2 height at the intermediate portion Wm, and the R height at the peripheral portion We as input into the inputting portion 121 and the values for the center height (reference), the R/2 height, and the R height as set in the setting portion 122.

The condition setting screen 100 depicted in FIG. 6 is an initial screen. Accordingly, in the fine adjusting shaft stored position display field 110, the present positions of the L shaft and the R shaft in each of the chuck tables CTA to CTD are displayed. On the other hand, in the wafer shape adjusting amount in Z2 grinding input field 120, all the values are 0. In this condition, the operator inputs the measured values for the center height (reference), the R/2 height, and the R height in the condition after performing the test fine grinding, into the present shape input field 121 in the wafer shape adjusting amount in Z2 grinding input field 120, thus obtaining a condition setting screen 100a depicted in FIG. 8. In the present shape input field 121 in the condition setting screen 100a depicted in FIG. 8, the value for the center height (reference) is 0 and the values for the R/2 height and the R height are relative values with respect to the value for the center height (reference). The center height (reference) is the height of the central portion Wo, the R/2 height is the height of the intermediate portion Wm, and the R height is the height of the peripheral portion We. In the present shape input field 121 in the example depicted in FIG. 8, a value of 0.00 μm for the center height (reference), a value of 0.50 μm for the R/2 height, and a value of 1.00 μm for the R height are input as the measured values on the wafer W in the condition after performing the test fine grinding. That is, the wafer W obtained by performing the test fine grinding is of a center thick type. However, the target sectional shape of the wafer W in the condition after performing the polishing is a uniform sectional shape such that the thickness of the wafer W is uniform. Accordingly, in the target shape input field 122 depicted in FIG. 8, the value for the center height (reference) is 0, the value for the R/2 height is 0, and the value for the R height is 0.

After the present shape and the target shape are input as mentioned above, the control portion 60 compares the target sectional shape of the wafer W as set in the setting portion 122 with the present sectional shape of the wafer W as input into the inputting portion 121 and then displays the values according to the present shape and the target shape in the fine adjusting shaft shift amount display field 123. Thereafter, the control portion 60 controls the inclination adjusting unit 56 to change the inclination of the rotation axis 513 so that the wafer can be ground to obtain the target sectional shape. The processing for this control will now be described in more detail.

As an example, as to the chuck table CTA, Table 1 depicts a present value for the distance from the origin sensor 523b to the upper end of the fine adjusting shaft 521 (L shaft) in the Z direction and a present value for the distance from the origin sensor 533b to the upper end of the fine adjusting shaft 531 (R shaft) in the Z direction. Further, a present value for the distance about the fixed shaft 541 is also depicted in Table 1. Further, a target value corresponding to each present value is also depicted in Table 1. The relative Z position of the fine adjusting shaft 521 (L shaft) with respect to the origin sensor 523b and the relative Z position of the fine adjusting shaft 531 (R shaft) with respect to the origin sensor 533b are displayed in the fine adjusting shaft stored position display field 110.

TABLE 1

| Shaft | Present Z position [μm] | Target Z position [μm] |
|---|---|---|
| Fixed shaft | 0.60 (ZF0) | 0 (ZF1) |
| L shaft | −0.32 (ZL0) | 0 (ZL1) |
| R shaft | −0.28 (ZR0) | 0 (ZR1) |

The control portion 60 reads out the values set in the setting portion 122. Then, the control portion 60 calculates a shift amount ML for the L shaft in the Z direction from Equation (1) to adjust the Z position of the L shaft.

$$ML = (ZL0 - ZF0) - (ZL1 - ZF1) \quad \text{Equation (1)}$$
$$= (-0.32 - 0.60) - (0 - 0)$$
$$= -0.92$$

Similarly, the control portion 60 calculates a shift amount MR for the R shaft in the Z direction from Equation (2) to adjust the Z position of the R shaft.

$$MR = (ZR0 - ZF0) - (ZR1 - ZF1) \quad \text{Equation (2)}$$
$$= (-0.28 - 0.60) - (0 - 0)$$
$$= -0.88$$

Figure 8:
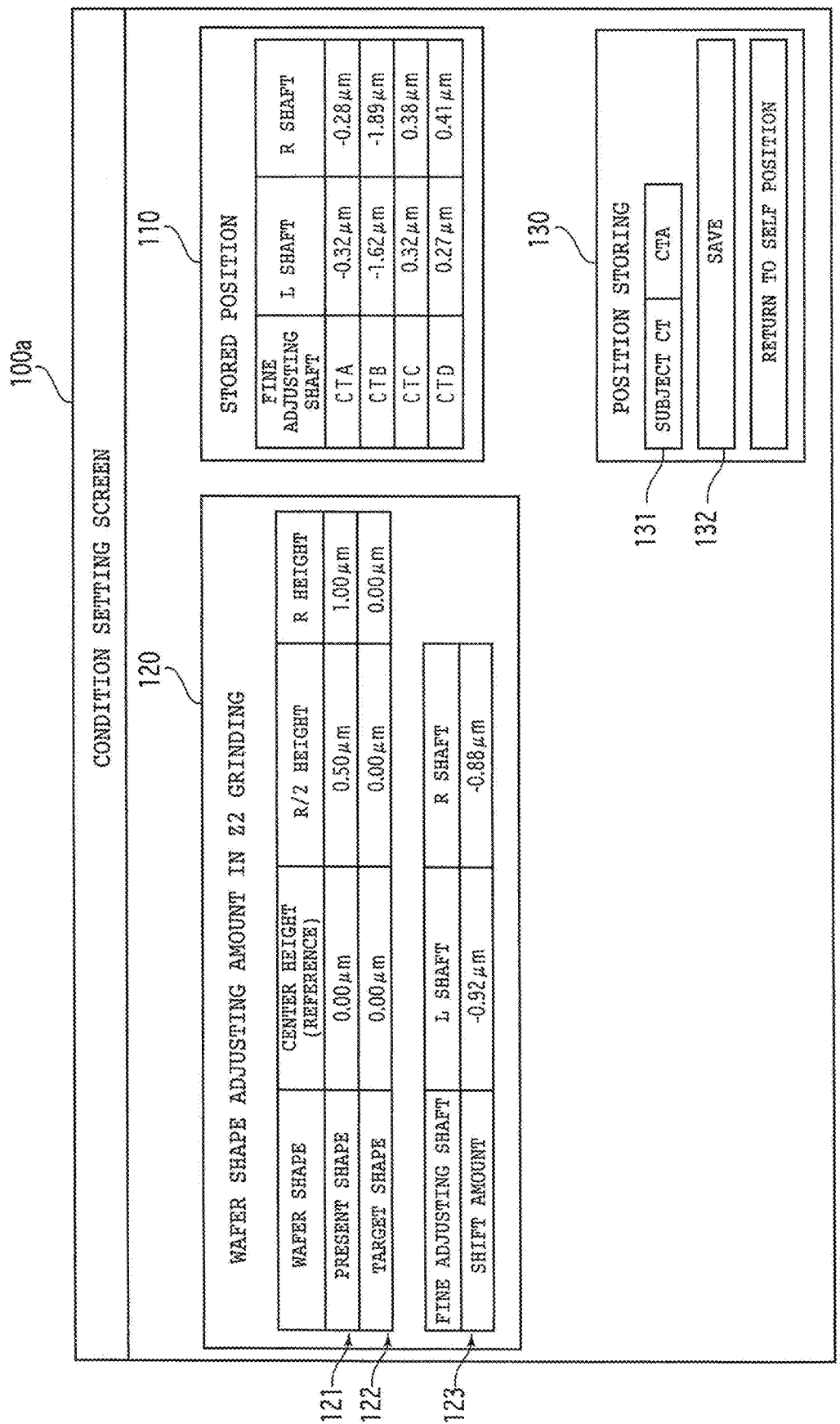
FIG. 8 is an illustration similar to FIG. 6, depicting a condition that a present sectional shape and a target sectional shape of the wafer are input and a shift amount for each fine adjusting shaft is displayed.

The control portion 60 next displays the above-calculated values for ML and MR in the fine adjusting shaft shift amount display field 123 of the condition setting screen 100a depicted in FIG. 8.

Figure 9:
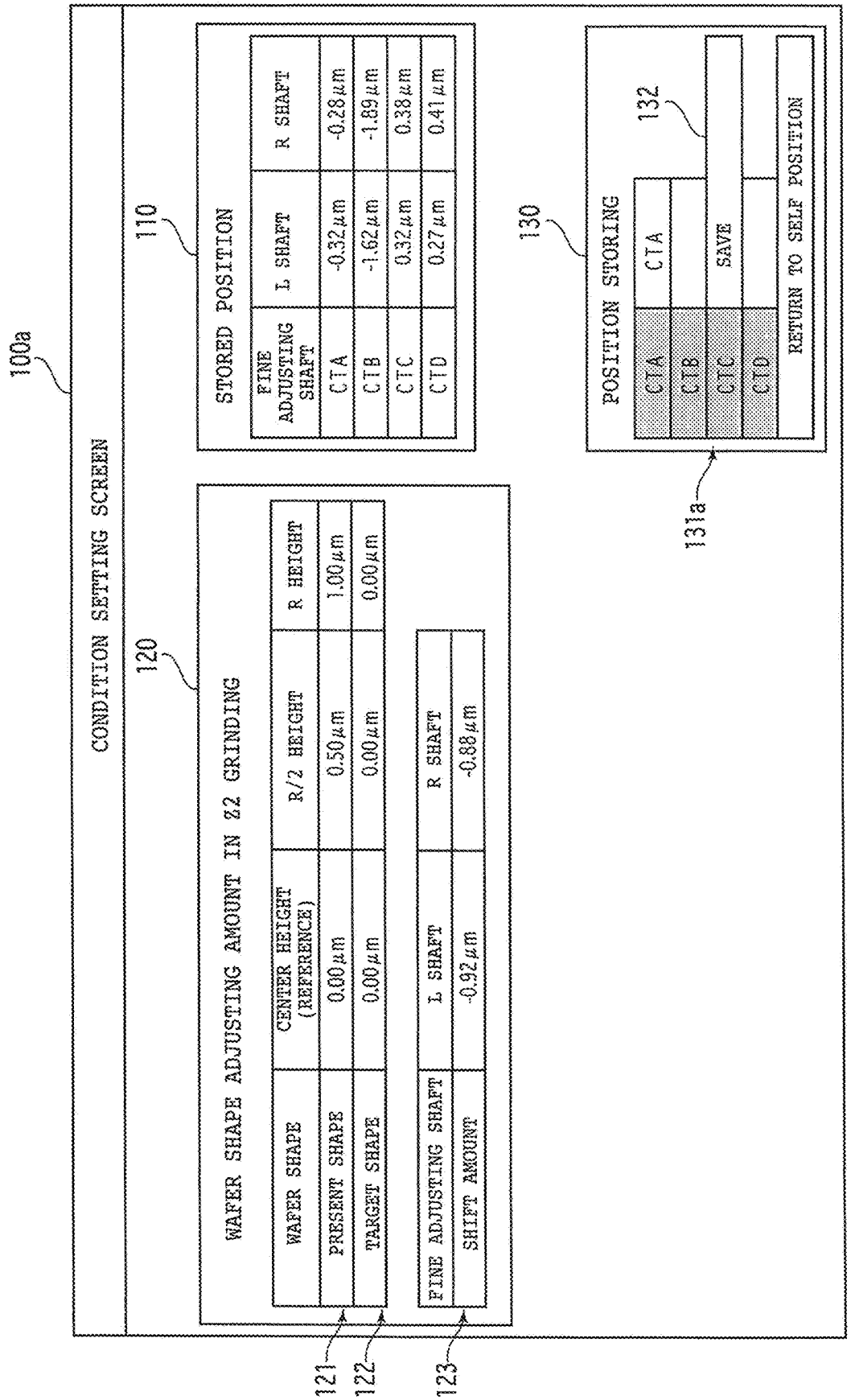
FIG. 9 is an illustration similar to FIG. 6, depicting a condition that a pull-down menu for use in selecting a subject one of the four chuck tables is displayed.

Thereafter, as depicted in a condition setting screen 100b in FIG. 9, the button of "subject CT" in the selecting portion 131 is touched by the operator to display a pull-down menu 131a. Then, "CTA" in the pull-down menu 131a is touched by the operator to select the chuck table CTA. Thereafter, save button 132 is touched by the operator to save the fine adjusting shaft shift amounts for the L shaft and the R shaft in the chuck table CTA.

Thereafter, the control portion 60 drives the motors 520 and 530 of the movable supporting portions 52 and 53 depicted in FIG. 2 to thereby move the fine adjusting shaft 521 (L shaft) and the fine adjusting shaft 531 (R shaft) by the above-obtained shift amounts. Thereafter, the control portion 60 adds the values indicating the present positions of the L shaft and the R shaft to the above-calculated values for the fine adjusting shaft shift amount. That is, the control portion 60 performs the following calculation.

$$-0.32+(-0.92)=-1.24$$

$$-0.28+(-0.88)=-1.16$$

The control portion 60 displays the results of this calculation in the fields of the L shaft and the R shaft for CTA in the fine adjusting shaft stored position display field 110 as depicted in a condition setting screen 100c in FIG. 10. Further, the values for the shift amount in the fine adjusting shaft shift amount display field 123 are returned to 0.

Also for the other chuck tables CTB, CTC, and CTD, a target value is input and the adjustment amounts for the L shaft and the R shaft in each chuck table are calculated in a similar manner. The calculated values for the adjustment amount are saved, and the heights of the L shaft and the R shaft are actually adjusted by the movable supporting portions 52 and 53 in the holding unit 51 for each chuck table. Then, the adjusted values for the height are displayed in the fine adjusting shaft stored position display field 110 as depicted in FIG. 10.

In this manner, the height of each of the chuck tables CTA to CTD is adjusted to thereby change the inclination of the rotation axis 513 in each holding unit 51. Thereafter, in the condition where the inclination of the rotation axis 513 has been changed, the polishing step is performed. Accordingly, the wafer W can be polished to obtain a uniform thickness.

However, it is difficult to make the thickness of the wafer W uniform by performing this adjustment once. In the case that the fine grinding is performed under the conditions adjusted and the sectional shape of the wafer W in the condition after performing the fine grinding does not become the values input into the present shape input field, the shift amounts of the fine adjusting shafts 521 and 531 are adjusted again. Thereafter, the fine grinding and the polishing are performed again. By repeating such an operation, the thickness of the wafer W can be made uniform.

As described above, the sectional shape of the wafer W in the condition after performing the fine grinding is set to a center thick type. Thereafter, the upper surface Wa of the wafer W is polished by using the polishing unit 4, so that the thickness of the wafer W can be made uniform.

As a modification, the target sectional shape of the wafer may be made different according to the chuck tables. Further, while the four holding units 51 are provided in this preferred embodiment, one or more holding units may be provided in the present invention.

Further, while the grinding apparatus 1 in this preferred embodiment includes the polishing unit 4, the grinding apparatus according to the present invention may not include a polishing unit. Further, the grinding apparatus according to the present invention may include a single grinding unit.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A grinding apparatus comprising:
a holding unit including a chuck table having a holding surface for holding a wafer, the chuck table being rotatable about a rotation axis passing through a center of the holding surface;
a grinding unit including a spindle having a rotation axis and a grinding wheel mounted at a lower end of the spindle, the grinding wheel having a plurality of abrasive members arranged annularly, wherein when the spindle is rotated to thereby rotate the grinding wheel, the wafer held on the chuck table is ground by the abrasive members of the grinding wheel being rotated;
an inclination adjusting unit for adjusting an inclination of the rotation axis of the chuck table with respect to the rotation axis of the spindle; and
a touch panel, wherein:
the abrasive members are adapted to grind the wafer held on the chuck table in a grinding area as a radial area ranging from the center of the holding surface to an outer circumference thereof, and
the touch panel is adapted to display a target shape input field for inputting information regarding a target sectional shape of the wafer and a present shape input field for inputting information regarding a present sectional shape of the wafer ground in a condition where the inclination of the rotation axis of the chuck table has not yet been changed, wherein the present shape input field includes at least a first present height input field and a second present height input field, and the target shape input field includes at least a first target height input field and a second target height input field, and further wherein the first and second target height input fields are configured and arranged to receive inputs of equal heights as well as inputs of unequal heights;
the grinding apparatus further comprising:
a control portion for comparing the information regarding the target sectional shape of the wafer as input into the target shape input field with the information regarding the present sectional shape of the wafer as input into the present shape input field and then controlling the inclination adjusting unit to change the inclination of the rotation axis of the chuck table so that the wafer is ground to obtain the target sectional shape of the wafer, and
wherein the inclination adjusting unit comprises:
at least three supporting portions configured and arranged for supporting the chuck table,
wherein the at least three supporting portions includes at least two moveable supporting portions that each include:
a threaded rotatable shaft,
an internally threaded receiving portion that is configured and arranged to receive the threaded rotatable shaft, and
a sensor seated within the internally threaded receiving portion for detecting a position of the threaded rotatable shaft received within the internally threaded receiving portion.
2. The grinding apparatus according to claim 1, wherein:
the holding unit includes a plurality of holding units each having the chuck table,
the grinding apparatus further comprising:
a positioning unit for moving one of the plurality of holding units to a grinding position where the wafer is ground by the grinding unit, wherein:

the touch panel is adapted to further display a selecting portion for use in selecting one of the plurality of holding units, and the control portion is adapted to change the inclination of the rotation axis of the chuck table in the holding unit selected by using the selecting portion.

3. The grinding apparatus according to claim 1, wherein: information regarding the sectional shape of the wafer is input into the target shape input field and the present shape input field every time processing conditions are set in processing the wafer.

4. The grinding apparatus according to claim 1, wherein: the first present height input field and the first target height input field both correspond to heights at a center of the wafer; and the second present height input field and the second target height input field both correspond to heights at an outer peripheral portion of the wafer.

5. The grinding apparatus according to claim 1, wherein: the present shape input field also includes a third present height input field; and the target shape input field includes a third target height input field.

6. The grinding apparatus according to claim 4, wherein: the present shape input field also includes a third present height input field, and the third present height input field corresponds to a height at an intermediate portion of the wafer, between the center of the wafer and the outer peripheral portion of the wafer; and the target shape input field includes a third target height input field, and the third target height input field corresponds to a height at an intermediate portion of the wafer, between the center of the wafer and the outer peripheral portion of the wafer.

7. The grinding apparatus according to claim 1, wherein the at least three supporting portions also includes a fixed supporting portion that includes a fixed shaft.

8. The grinding apparatus according to claim 1, wherein the internally threaded receiving portion is fixed to a lower surface of a frame of the chuck table.

\* \* \* \* \*